(12) United States Patent
Chisaka

(10) Patent No.: US 10,720,922 B1
(45) Date of Patent: Jul. 21, 2020

(54) SEMICONDUCTOR DEVICE

(71) Applicants: KABUSHIKI KAISHA TOSHIBA, Minato-ku (JP); Toshiba Electronic Devices & Storage Corporation, Minato-ku (JP)

(72) Inventor: Junichi Chisaka, Kawasaki (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/516,632

(22) Filed: Jul. 19, 2019

(30) Foreign Application Priority Data

Jan. 29, 2019 (JP) .................................. 2019-013410

(51) Int. Cl.
*H03K 17/687* (2006.01)
(52) U.S. Cl.
CPC ................................ *H03K 17/6871* (2013.01)
(58) Field of Classification Search
CPC .......................... H03K 17/6871; H03K 17/567
USPC ......................... 327/108, 109, 110, 111, 112
See application file for complete search history.

(56) References Cited

U.S. PATENT DOCUMENTS

| 7,924,084 B2 | 4/2011 | Kojima |
| 2017/0272069 A1 | 9/2017 | Chisaka |

FOREIGN PATENT DOCUMENTS

| JP | 2008-67292 | 3/2008 |
| JP | 5064905 | 10/2012 |
| JP | 6378230 | 8/2018 |

*Primary Examiner* — John W Poos
(74) *Attorney, Agent, or Firm* — Oblon, McClelland, Maier & Neustadt, L.L.P.

(57) ABSTRACT

According to one embodiment, a semiconductor device includes: a boost circuit configured to apply a first voltage to a gate terminal; a first switching element, a first resistor, and a second resistor that are coupled in parallel between the gate terminal and a source terminal; a second switching element coupled in series with the second resistor between the gate terminal and the source terminal; a switching element control circuit configured to switch, in response to a change of a voltage from the first voltage applied from the boost circuit to the gate terminal to being indeterminate, the first switching element to on state after switching the second switching element to on state. A resistance value of the second resistor is smaller than a resistance value of the first resistor.

15 Claims, 6 Drawing Sheets

SEMICONDUCTOR DEVICE

CROSS-REFERENCE TO RELATED APPLICATIONS

This application is based upon and claims the benefit of priority from Japanese Patent Application No. 2019-013410, filed Jan. 29, 2019, the entire contents of which are incorporated herein by reference.

FIELD

Embodiments described herein relate generally to a semiconductor device.

BACKGROUND

Semiconductor devices is known for providing a constant electric power supply to a load.

DETAILED DESCRIPTION

In general, according to one embodiment, a semiconductor device includes: a boost circuit configured to apply a first voltage to a gate terminal; a first switching element, a first resistor, and a second resistor that are coupled in parallel between the gate terminal and a source terminal; a second switching element coupled in series with the second resistor between the gate terminal and the source terminal; a switching element control circuit configured to switch, in response to a change of a voltage from the first voltage applied from the boost circuit to the gate terminal to being indeterminate, the first switching element to on state after switching the second switching element to on state. A resistance value of the second resistor is smaller than a resistance value of the first resistor.

Hereinafter, embodiments of the present invention will be described with reference to the drawings. It should be noted that, in the following description, structural elements having the same functions and configurations will be denoted using reference symbols common thereto. In addition, where a plurality of structural elements denoted by reference symbols common thereto is to be distinguished, the reference symbols common thereto will be denoted by additional subscript numbers. It should further be noted that where a plurality of structural elements do not require any special distinction, the plurality of structural elements will only be denoted by reference symbols common thereto without subscript numbers.

1. First Embodiment

A semiconductor device according to a first embodiment will be described.

The semiconductor device according to the first embodiment is, for example, an IC (Integrated Circuit) chip, and is a driver for driving a switching element that outputs an electric power supply voltage to a load.

1.1 Configuration

A configuration of a semiconductor device according to the first embodiment will be described.

Figure 1:
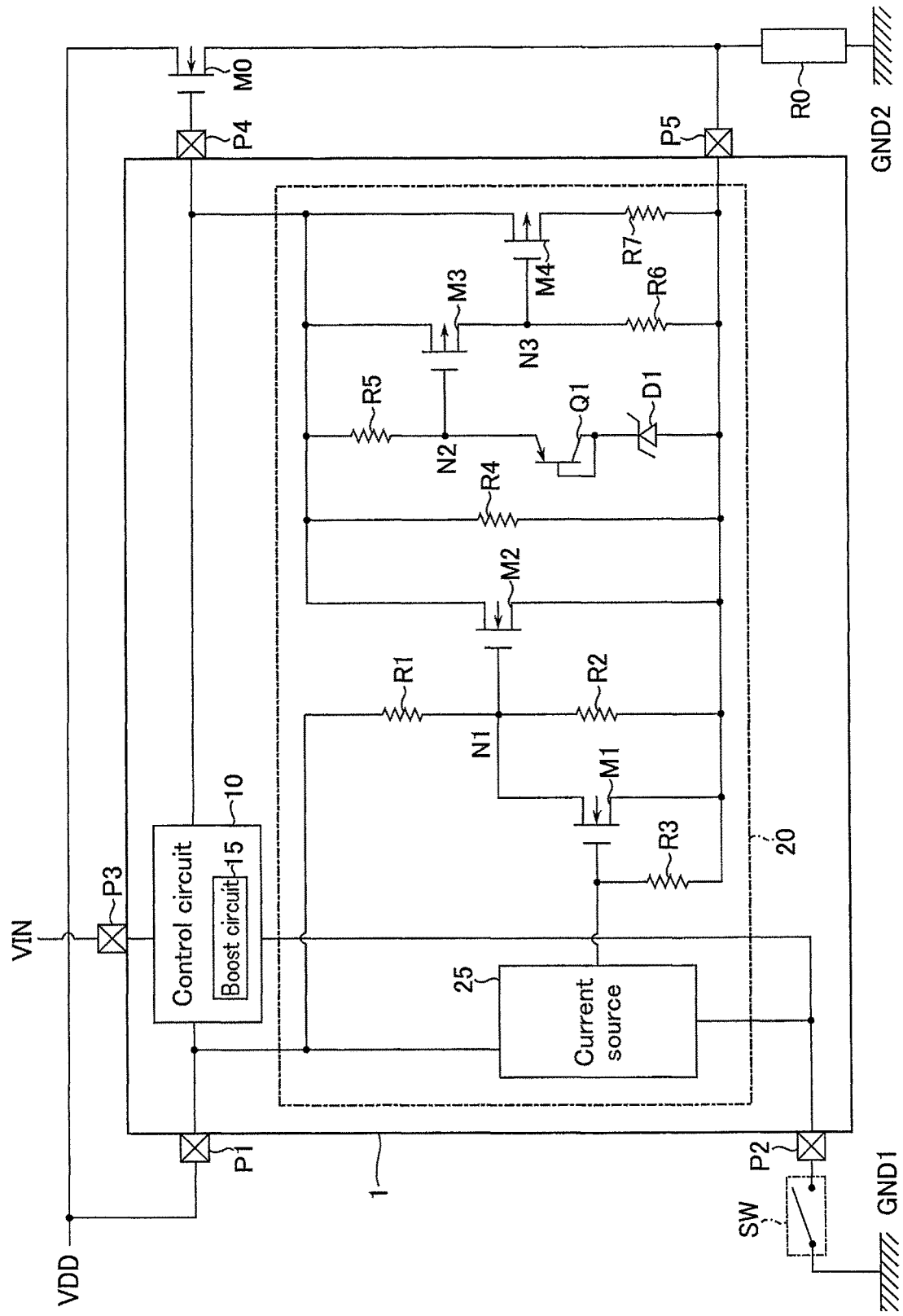
FIG. 1 is a circuit diagram for describing a configuration of a semiconductor device according to a first embodiment.

FIG. 1 is a circuit diagram for describing the configuration of the semiconductor device according to the first embodiment.

As shown in FIG. 1, the semiconductor device 1 is configured to drive a switching element M0 that outputs a voltage VDD to a load R0. The semiconductor device 1, the switching element M0, and the load R0 may, for example, correspond to parts in an automotive on-board system. The voltage VDD is an electric power supply voltage for driving the semiconductor device 1, the switching element M0, and the load R0.

The switching element M0 is a switch that can control a voltage supply to the load R0. The switching element M0 is, for example, an MOS (Metal-Oxide-Semiconductor) transistor having an n-type conductivity, and the switching element M0 includes a first end (drain end) where the voltage VDD is supplied, a second end (source end) connected to the first end of the load R0, and a gate connected to the semiconductor device 1.

The load R0 corresponds to, for example, a headlight, a car navigation system, etc., and includes a second end grounded to a voltage GND2. As a result, when the switching element M0 is switched to ON, the load R0 is supplied with the voltage VDD via the switching element M0 to exhibit a predetermined function. On the other hand, when the switching element M0 is switched to OFF, the load R0 is electrically disconnected from the voltage VDD, and stops the predetermined function. The voltage GND2 is, for example, a ground voltage for the load R0, and sets a reference potential of the load R0. It should be noted that the voltage GND2 is set independently of a ground voltage for the semiconductor device 1 described later.

The semiconductor device 1 has terminals P1, P2, P3, P4, and P5.

Each of the terminals P1 and P2 is a terminal coupled to a voltage source for driving various circuits in the semiconductor device 1.

More specifically, the terminal P1 is a power supply terminal supplied with the voltage VDD.

The terminal P2 is a ground terminal grounded to a voltage. GND1 via a switch SW. The voltage GND1 is, for example, the ground voltage for the semiconductor device 1, and sets a reference potential of the semiconductor device 1. The switch SW is a virtual circuit for schematically showing a state of electrical connection between the terminal P2 and the voltage GND1. That is, when the switch SW is ON, it indicates that the terminal P2 is normally grounded to the voltage GND1, while when the switch SW is OFF, the terminal P2 is electrically disconnected from the voltage GND1 (e.g., a interconnect for grounding the terminal P2 is broken). In the following description, the passage "the switch SW is switched from ON to OFF" can be read as "a voltage at the terminal P2 changes from the voltage GND1 to an indeterminate state", "the terminal P2 is in a floating state with respect to the voltage GND1", "the terminal P2 opens" or "the terminal P2 is in a high impedance state".

The terminal P3 is a terminal to which a voltage VIN is supplied. The voltage VIN is a voltage serving as a trigger for the semiconductor device 1 to start operations. That is, by supplying the voltage VIN to the terminal P3, the semiconductor device 1 becomes operable.

The terminal P4 is a terminal to which the output voltage from the semiconductor device 1 is output, and it is coupled to the gate of the switching element M0. The terminal P4 is also referred to as the "gate terminal".

The terminal P5 is a terminal coupled between the source end of the switching element M0 and the load R0. The terminal P5 is also referred to as the "source terminal".

The semiconductor device 1 further includes a control circuit 10 and a GND disconnection-protecting circuit 20.

The control circuit 10 is a circuit that entirely controls the operations of the semiconductor device 1, and includes a first input terminal coupled to the terminal P1, a second input terminal coupled to the terminal P2, a third input terminal coupled to the terminal P3, and an output terminal coupled to the terminal P4. The control circuit 10 can start the operations by receiving the voltage VIN from the terminal P3. Also, the control circuit 10 includes, for example, a boost circuit 15.

The boost circuit 15 is configured to output an output voltage greater than a potential difference between the voltages VDD and GND1 to the terminal P4 based on the voltages VDD and GND1 supplied from the terminals P1 and P2, respectively. The output voltage of the boost circuit 15 is so large that it can switch to ON the switching element M0.

When the supply of the voltage VDD or GND1 is stopped (that is, when the terminal P1 is electrically disconnected from the voltage VDD or the terminal P2 is electrically disconnected from the voltage GND1), the boost circuit 15 stops putting out voltage to P4. When the output of the output voltage from the boost circuit 15 to the terminal P4 is stopped, the voltage at the terminal P4 changes from the state kept constant by the output voltage from the boost circuit 15 to being indeterminate. When the voltage at the terminal P4 is indeterminate, a period occurs in which the switching element M0 is unintentionally switched to ON, which may damage the switching element M0, which is not preferable. Therefore, the GND disconnection-protecting circuit 20 is provided in the semiconductor device 1 so that the period in which the voltage at the terminal P4 is indeterminate can be shortened as much as possible.

The GND disconnection-protecting circuit 20 includes switching elements M1, M2, M3, M4, and Q1, resistors R1, R2, R3, R4, R5, R6, and R7, a diode D1, and a current source 25. The switching elements M1 and M2 include, for example, MOS transistors having an n-type conductivity. The switching elements M3 and M4 include, for example, MOS transistors having p-type conductivity. The switching element Q1 includes, for example, a pnp transistor. The diode D1 includes, for example, a Zener diode.

The current source 25 includes a first input terminal coupled to the terminal P1, a second input terminal coupled to the terminal P2, and an output terminal coupled to the terminal P5 via the resistor R3. The current source 25 is configured to cause a predetermined current to flow to the terminal P5 via the resistor R3 based on the voltage VDD supplied from the terminal P1 and the voltage GND1 supplied from the terminal P2.

It should be noted that when the supply of voltage VDD or GND1 is stopped (that is, when the terminal P1 is electrically disconnected from the voltage VDD or the terminal P2 is electrically disconnected from the voltage GND1), the current source 25 stops the output of the predetermined current to the resistor R3.

The resistor R1 includes a first end coupled to the terminal P1 and a second end coupled to a node N1. The resistor R2 includes a first end coupled to the node N1 and a second end coupled to the terminal P5.

The resistor R3 includes a first end coupled to the output terminal of the current source 25 and a second end coupled to the terminal P5. The switching element M1 includes a first end (drain end) coupled to the node N1, a second end (source end) coupled to the terminal P5, and a gate coupled between the output terminal of the current source 25 and the first end of the resistor R3. It should be noted that the resistor R3 has a function of generating a potential difference between the gate and the source of the switching element M1 that can switch the switching element M1 to ON by the predetermined current output from the current source 25.

By the above-described configurations, the current source 25 and the resistor R3 function as a switching element control circuit for switching the switching element M1 from ON to OFF when the terminal P2 is electrically disconnected from the voltage GND1.

The switching element M2 includes a first end (drain end) coupled to the terminal P4, a second end (source end) coupled to the terminal P5, and a gate coupled to the node N1. The resistor R4 includes a first end coupled to the terminal P4 and a second end coupled to the terminal P5. The switching element M2 and the resistor R4 are coupled in parallel to each other between the terminal P4 and the terminal P5.

The resistor R5, the switching element Q1, and the diode D1 coupled in series are coupled in parallel to the switching element M2 and the resistor R4 between the terminal P4 and the terminal P5.

The resistor R5 includes a first end coupled to the terminal P4 and a second end coupled to a node N2.

The switching element Q1 includes a first end (emitter terminal) coupled to the node N2, and a second end (base terminal) and a third end (collector terminal) that are coupled to the output terminal of the diode D1. The diode D1 includes an input terminal coupled to the terminal P5. The switching element Q1 and the diode D1 function as a constant voltage source that keeps a potential difference between the terminal P5 and the node N2 at a predetermined value.

The switching element M3 and the resistor R6 coupled in series are coupled in parallel to the switching element M2 and the resistor R4 between the terminal P4 and the terminal P5.

The switching element M3 includes a first end (source end) coupled to the terminal P4, a second end (drain end) coupled to a node N3, and a gate coupled to the node N2. The resistor R6 includes a first end coupled to the node N3 and a second end coupled to the terminal P5.

The switching element M4 and the resistor R7 coupled in series are coupled in parallel to the switching element M2 and the resistor R4 between the terminal P4 and the terminal P5.

The switching element M4 includes a first end (source end) coupled to the terminal P4, a second end (drain end) coupled to the first end of the resistor R7, and a gate coupled to the node N3. The resistor R7 includes a second end coupled to the terminal P5. That is, the switching element M4 and the resistor R7 are coupled in series between the terminal P4 and the terminal P5.

The resistor R7 has a lower resistance than the resistors R4, R5, and R6. Further, among paths coupled between the terminal P4 and the terminal P5, the resistor R7 can have a resistance value lower than a combined resistance of: a resistance value of a path via the resistor R4, a resistance value of a path via the resistor R5, and a resistance value of a path via the resistor R6.

By the above-described configurations, the resistor R5, the switching element Q1, the diode D1, the switching element M3, and the resistor R6 can function as a switching element control circuit configured to switch the switching element M4 from OFF to ON when the voltage at the terminal P4 is indeterminate. Also, a path via the resistor R7 in which the switching element M4 is switched to ON is a path that, except for a path via the switching element M2 where the switching element M2 is switched to ON, has a lower resistance than the other paths coupled in parallel between the terminal P4 and the terminal P5.

1.2 Operation

Next, an operation of the semiconductor device according to the first embodiment will be described.

Figure 2:
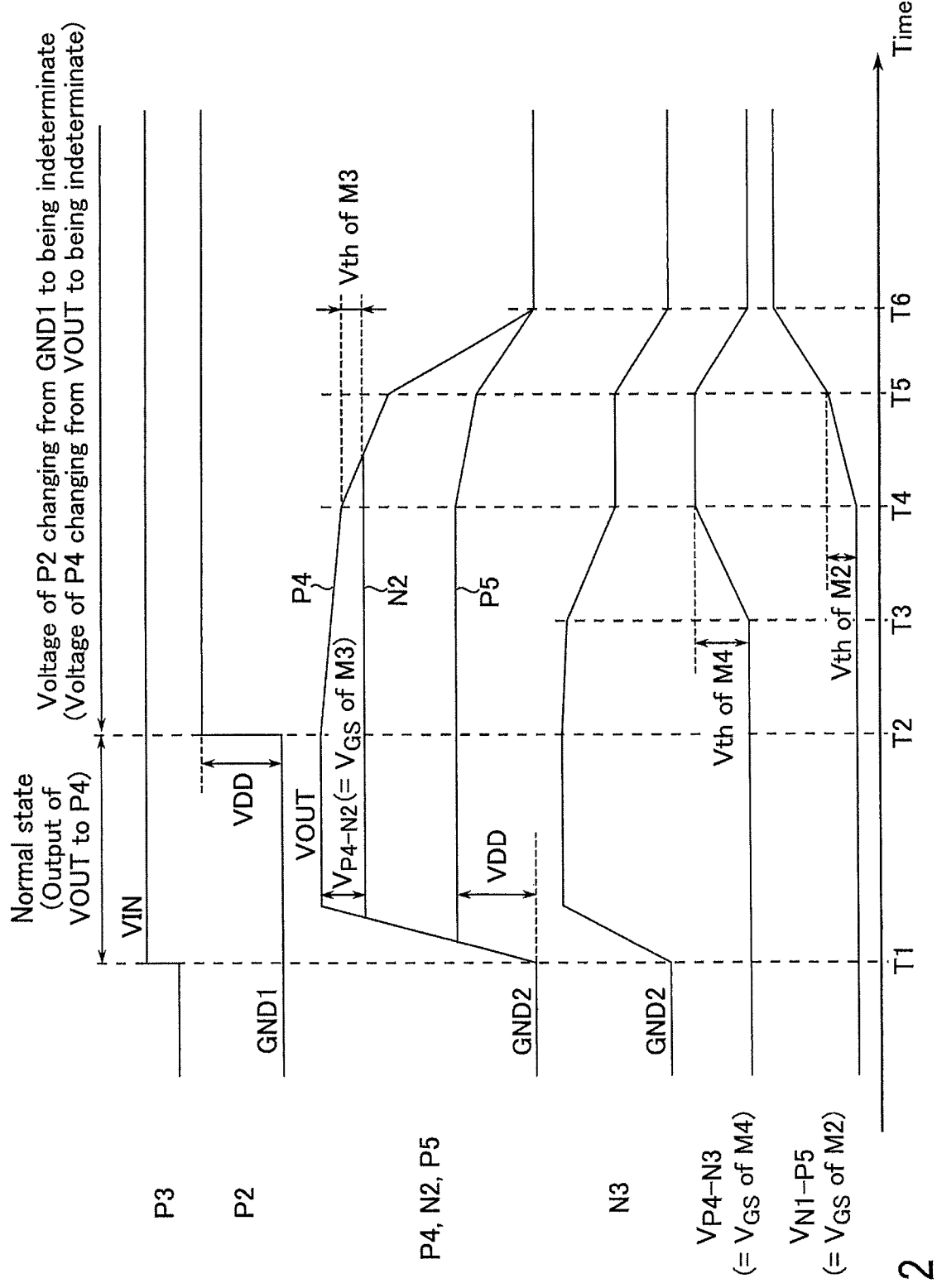
FIG. 2 is a timing chart for describing an operation of the semiconductor device according to the first embodiment.

FIG. 2 is an example of a timing chart for describing the operation for the GND disconnection protection by the semiconductor device according to the first embodiment. Shown in time series in FIG. 2 are: a normal state in which the voltages VDD and GND1 are normally supplied to the semiconductor device 1, and a state in which the supply of the voltage GND1 is stopped due to the occurrence of disconnection. The normal state corresponds to a period before time T2, and the state in which the supply of the voltage GND1 is stopped corresponds to a period later than T2.

As shown in FIG. 2, the semiconductor device 1 is not supplied with the voltage VIN via the terminal P3 until the time T1. As a result, the boost circuit 15 does not apply a voltage for switching ON the switching element M0 to the terminal P4. Therefore, the switching element M0 is switched to OFF, and the voltage at the terminals P4 and P5 becomes the voltage GND2.

At the time T1, the voltage VIN is applied to the terminal P3. Thus, the boost circuit 15 outputs the voltage VOUT (>|VDD−GND1|) to the terminal P4 based on the voltage VDD supplied from the terminal P1 and the voltage GND1 supplied from the terminal P2. Along with this, the switching element M0 is switched to ON, and the supply of the voltage VDD to the load R0 starts (that is, the voltage at the terminal P5 rises to the voltage VDD).

The voltage of the node N2 rises, with respect to the voltage of terminal P5, to a predetermined value determined by the characteristics of the switching element Q1 and the diode D1. As a result, a potential difference (denoted in FIG. 2 as "$V_{GS}$ of M3" or "$V_{P4-N2}$") between the gate and the source of the switching element M3 is generated. Since the potential difference $V_{P4-N2}$ exceeds a threshold voltage Vth of the switching element M3, the switching element M3 is switched to ON, and the terminal P4 and the terminal P5 are electrically connected via the resistor R6.

The voltage of the node N3 is the voltage VOUT when the switching element M3 is switched to ON. Therefore, there is no significant potential difference (denoted in FIG. 2 as "$V_{GS}$ of M4" or "$V_{P4-N3}$") between the gate and the source of the switching element M4. Since the potential difference $V_{P4-N3}$ is below a threshold voltage Vth of the switching element M4, the switching element M4 is switched to OFF.

It should be noted that, although not shown in FIG. 2, the current source 25 outputs a predetermined current toward the terminal P5. As a result, a potential difference between the gate and the source of the switching element M1 is generated, and the switching element M1 is switched to ON.

Therefore, the gate and the source of the switching element M2 are electrically connected via the switching element M1, and the switching element M2 is switched to OFF.

Subsequently, at the time T2, for example, due to the occurrence of disconnection, the switch SW is switched from ON to OFF. As a result, the voltage at the terminal P2 goes from the voltage GND1 to being indeterminate. In the example of FIG. 2, the terminal P2 is pulled up by the voltage at the terminal P1 and becomes the voltage VDD. As a result, the boost circuit 15 cannot boost the voltage VDD, and stops the output of the voltage VOUT to the terminal P4. The voltage at the terminal P4 changes from being fixed to the constant voltage VOUT to being indeterminate.

As the voltage at the terminal P4 becomes indeterminate, the charge of the terminal P4 is gradually drawn toward the terminal P5 via either: the resistor R4; the resistor R5, the switching element Q1, and the diode D1; or the switching element M3 and the resistor R6. Since the voltage at the terminal P4 gradually decreases from the voltage VOUT, the potential difference between the terminal P4 and the terminal P5 gradually decreases.

On the other hand, as described above, since the switching element Q1 and the diode D1 operate as a voltage source, the voltage of the node N2 does not change. For this reason, the potential difference $V_{P4-N2}$ gradually decreases.

Although not shown in FIG. 2, the current source 25 stops the output of the predetermined current toward the terminal P5 when the voltage at the terminal P2 is indeterminate. Thus, there is no potential difference between the gate and the source of the switching element M1, and the switching element M1 is switched to OFF. As a result, the only path coupled between the gate and the source of the switching element M2 is a path via the resistor R2. At the time T2, the voltage at the terminal P5 is the voltage VDD, so that the switching element M2 is still switched to OFF.

At the time T3, the operating state of the switching element M3 is gradually switched to OFF, and transitions from, for example, a saturation region to a linear region. Along with this, the decrease of the potential difference $V_{P4-N2}$ accelerates, and the potential difference $V_{P4-N3}$ between the gate and the source of the switching element M4 starts to increase.

At the time T4, the potential difference $V_{P4-N2}$ is smaller than the threshold voltage Vth of the switching element M3, and the switching element M3 is switched to OFF. Accordingly, the node N3 is electrically disconnected from the terminal P4, and the potential difference $V_{P4-N3}$ is greater than the threshold voltage Vth of the switching element M4. Thereby, the switching element M4 is switched to ON, and a path electrically coupled between the terminal P4 and the terminal P5 via the resistor R7 is formed.

Here, the resistance value of the resistor R7 is smaller than the resistance value of the resistor R4. That is, the force for drawing the charge from the terminal P4 toward the terminal P5 is greater on the path via the resistor R7 than on the path via the resistor R4. Therefore, the voltage decline speed of the terminal P4 after the time T4 is faster than the voltage decline speed from the time T2 to the time T4.

As the voltage at the terminal P4 decreases, the operating state of the switching element M0 is gradually switched to OFF, and transitions from, for example, the saturation region to the linear region. Along with this, the voltage at the terminal P5 starts to drop from the voltage VDD. As a result, a potential difference is generated between the terminal P1 and the terminal P5, and a partial resistance determined by the resistors R1 and R2 is applied to the node N1. As a result, a potential difference (denoted in FIG. 2 as "Vas of M2" or "$V_{N1\text{-}P5}$") between the gate and the source of the switching element M2 is generated.

At the time T5, the potential difference $V_{N1\text{-}P5}$ is greater than a threshold voltage Vth of the switching element M2, and the switching element M2 is switched to ON. Accordingly, the terminals P4 and P5 are electrically coupled via the switching element M2, and the path between the terminals P4 and P5 is substantially shortened. Thereby, the charge of the terminal P4 is rapidly drawn toward the terminal P5, and, at the time T6, the switching element M0 is completely switched to OFF.

By the above-described operation, the switching element M0 can be quickly switched to OFF after the switch SW is switched to OFF, and it is possible to suppress the likelihood of malfunction of the switching element M0 caused by the switch SW being switched to OFF.

1.3 Effects of Present Embodiment

According to the first embodiment, it is possible to suppress malfunction caused by potential change of the terminal P2. Below, the effects of the present embodiment will be described.

The boost circuit 15 is configured to be able to apply the voltage VOUT to the terminal P4. However, the boost circuit 15 cannot apply the voltage VOUT if the voltage supplied to the terminal P2 changes from the voltage GND1 to being indeterminate. As a result, the voltage at the terminal P4 changes from the voltage VOUT to being indeterminate.

According to the first embodiment, the switching element M2, the resistor R4, and the resistor R7 having a smaller resistance value than the resistor R4 are coupled in parallel to each other between the terminal P4 and the terminal P5. The switching element M4 is coupled in series with the resistor R7 between the terminal P4 and the terminal P5. Further, the resistor R5, the switching element Q1, the diode D1, the switching element M3, and the resistor R6 are configured to switch, in response to the voltage at the terminal P4 changing from the voltage VOUT to being indeterminate, the switching element M4 from OFF to ON, and subsequently to switch the switching element M2 from OFF to ON. As a result, it is possible to suppress an increase of the period in which the switching element M0 is switched to ON despite the terminal P4 being indeterminate.

Supplementally, since the resistor R4 is a path continuously electrically coupled between the terminal P4 and the terminal P5, it has the effect of drawing the charge of the terminal P4 toward the terminal P5 even in the normal state. Therefore, although reducing the resistance value of the resistor R4 more than necessary can cause the switching element M0 to be quickly switched to OFF when the terminal P4 is indeterminate, it is not preferable because the boost performance of the boost circuit 15 in the normal state can also diminish. Therefore, using only the path via the resistor R4 to draw the charge of the terminal P4 toward the terminal P5 until the switching element M2 is switched to OFF may cause the switching element M0 to malfunction over a long period of time.

On the other hand, according to the first embodiment, when the voltage at the terminal P4 is gradually decreased by the resistor R4, the switching element M3 is switched to OFF before the switching element M2 is switched to OFF. Thus, the switching element M4 can be switched to ON before the switching element M2 is switched to OFF. Therefore, the terminals P4 and P5 are electrically coupled via the resistor R7, and a path in which current flows more easily than the resistor R4 is formed. In this manner, the voltage at the terminal P4 can be reduced earlier than in a case of using the path via the resistor R4, so that the switching element M2 can be switched earlier to ON, and the time it takes for the switching element M0 to be switched to OFF can be shortened.

In addition, the current source 25 is configured to stop, in response to the voltage at the terminal P2 changing from the voltage GND1 to being indeterminate, the current output to the terminal P5 via the resistor R3. Thus, the switching element M1 can be switched to ON while the current is output from the current source 25, and can be switched to OFF when the voltage at the terminal P2 goes from the voltage GND1 to being indeterminate.

Also, the switching element M1 couples, together with the resistor R2, between the gate and the source of the switching element M2. For this reason, while the current source 25 operates normally, the switching element M2 is always short-circuited between the gate and the source by the switching element M1, so the switching element M2 can always be switched to OFF. On the other hand, when the current source 25 detects that the terminal P2 is indeterminate etc., and switches the switching element M1 to OFF, a potential difference between the gate and the source of the switching element M2 can be increased by the resistor R2, and the switching element M2 can be switched to ON in response to the decrease in voltage at the terminal P5. Therefore, it is possible to ultimately short-circuit the terminals P4 and P5 and suppress malfunction of the switching element M0.

2. Second Embodiment

Next, a semiconductor device according to a second embodiment will be described. The second embodiment is different from the first embodiment in the regard that what is used is not a voltage source that can determine the potential difference between the node N2 and the terminal P5 independently of the resistor R5, but one that can determine the potential difference based on voltage division with the resistor R5. In the following, descriptions of configurations and operations same as in the first embodiment will be omitted, and mainly configurations and operations different from those of the first embodiment will be described.

2.1 Configuration

Figure 3:
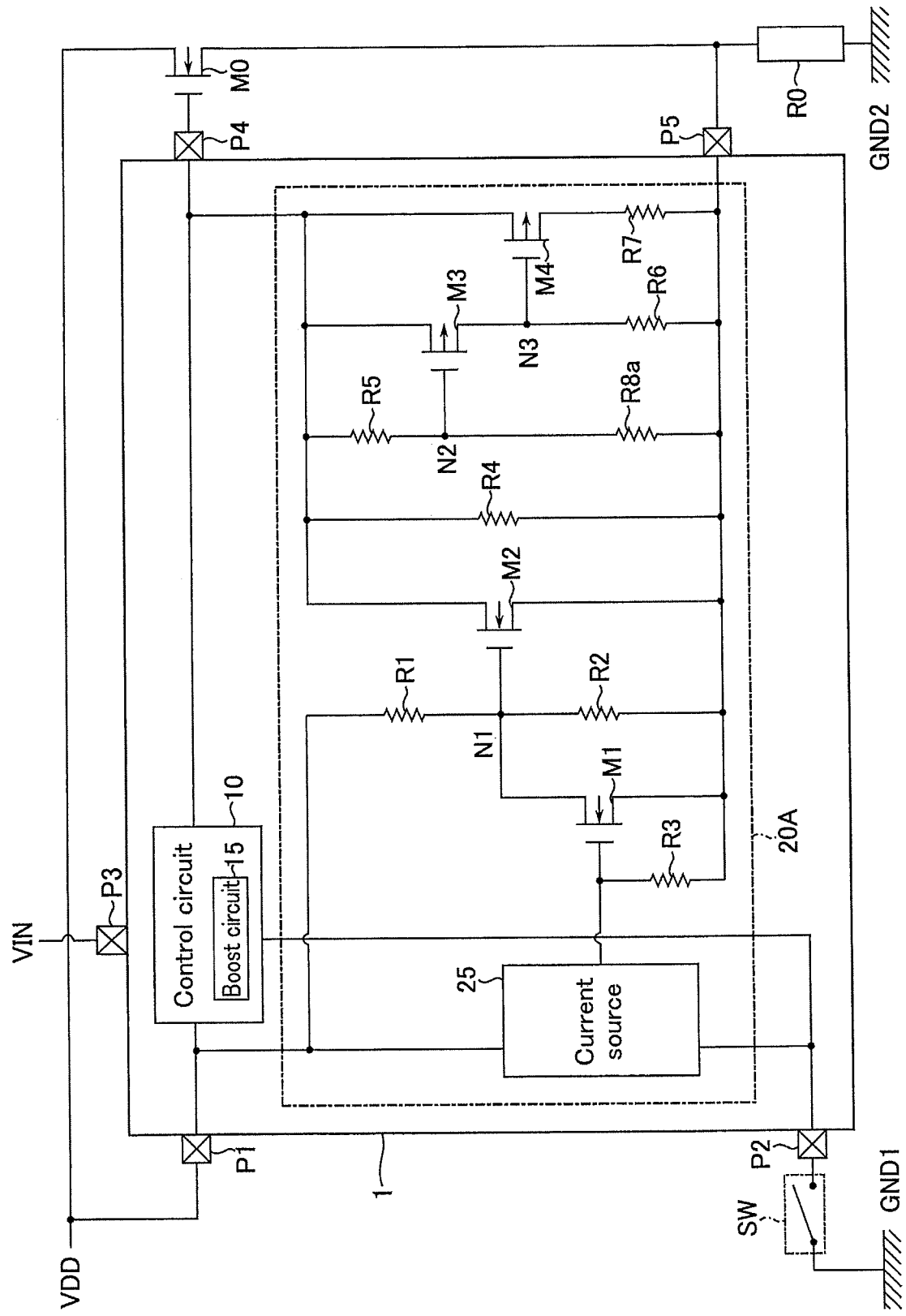
FIG. 3 is a circuit diagram for describing a configuration of a semiconductor device according to a second embodiment.

FIG. 3 is a circuit diagram for explaining a configuration of the semiconductor device according to the second embodiment. FIG. 3 corresponds to FIG. 1 of the first embodiment.

As shown in FIG. 3, the semiconductor device 1 includes a GND disconnection-protecting circuit 20A instead of the GND disconnection-protecting circuit 20 shown in FIG. 1.

The GND disconnection-protecting circuit 20A includes a resistor R8a instead of the switching element Q1 and the diode D1. In other words, the resistor R8a includes a first end coupled to the node N2, and a second end coupled to the terminal P5. The resistors R5 and R8a are configured to determine the voltage (partial voltage) applied to the node N2 according to the ratio of the respective resistance values.

2.2 Operation

Figure 4:
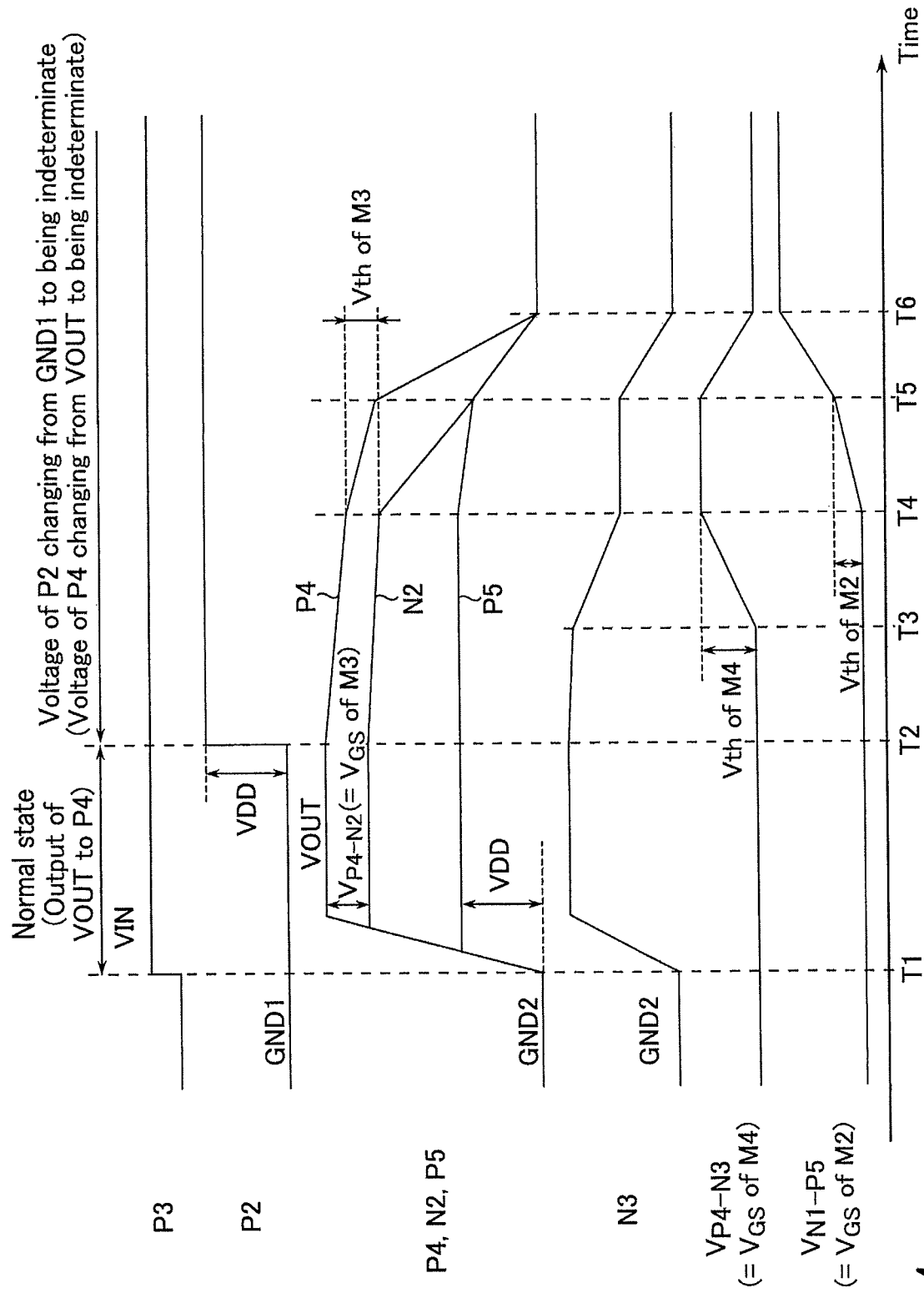
FIG. 4 is a timing chart for describing an operation of the semiconductor device according to the second embodiment.

FIG. 4 is a timing chart for explaining an operation of the semiconductor device according to the second embodiment. FIG. 4 corresponds to FIG. 2 of the first embodiment.

As shown in FIG. 4, the operations up to the time T2 are the same as those of FIG. 2.

At the time T2, the switch SW is switched from ON to OFF due to, for example, the occurrence of a disconnection. As a result, the voltage at the terminal P2 goes from the voltage GND1 to being indeterminate, and is drawn by the voltage at the terminal P1 to become the voltage VDD. Therefore, the boost circuit 15 cannot boost the voltage VDD, and stops the output of the voltage VOUT to the terminal P4. The voltage at the terminal P4 changes from being fixed to the constant voltage VOUT to being indeterminate.

As the voltage at the terminal P4 is indeterminate, the terminal P4 is gradually drawn toward the terminal P5 either via the resistor R4, via the resistors R5 and R8a, or via the switching element M3 and the resistor R6. Since the voltage at the terminal P4 gradually decreases from the voltage VOUT, the potential difference between the terminal P4 and the terminal P5 gradually decreases.

On the other hand, as described above, the resistor R8a functions as a voltage source that determines the voltage of the node N2 in accordance with the ratio of the resistance value to the resistor R5. Thus, the voltage of the node N2 gradually decreases as the voltage at the terminal P4 decreases. For this reason, the potential difference $V_{P4-N2}$ gradually decreases.

It should be noted that, although not shown in FIG. 4, the current source 25 stops the output of the predetermined current toward the terminal P5 when the voltage at the terminal P2 is indeterminate. Thus, there is no potential difference between the gate and the source of the switching element M1, and the switching element M1 is switched to OFF. As a result, the only path connected between the gate and the source of the switching element M2 is the path via the resistor R2. At the time T2, since the terminal P5 is at the voltage VDD, the switching element M2 is still switched to OFF.

At the time T3, the operating state of the switching element M3 is gradually switched to OFF, and transitions from, for example, the saturation region to the linear region. Along with this, the decrease of the potential difference $V_{P4-N2}$ accelerates, and the potential difference $V_{P4-N3}$ between the gate and the source of the switching element M4 starts to increase.

The subsequent operations are the same as those shown in FIG. 2.

By the above-described operations, the switching element M0 can be quickly switched to OFF after the switch SW is switched to OFF, and malfunction of the switching element M0 caused by the switch SW being switched to OFF can be suppressed.

2.3 Effects of Present Embodiment

According to the second embodiment, the gate of the switching element M3 is coupled between the resistor R5 that is coupled to the terminal P4 and the resistor R8a that is coupled to the terminal P5. As a result, the same effects as in the first embodiment can be obtained by using the voltage source determining the potential difference between the terminal P5 and the node N2 by the partial voltage instead of the voltage source that can keep the potential difference between the terminal P5 and the node N2 constant, for example, the pnp transistor and the Zener diode coupled in series.

3. Modifications

Although various embodiments have been described above, the first embodiment and the second embodiment are not restricted to the aforementioned, and may be modified in various ways.

For example, although the first embodiment and the second embodiment have described the case where the switching elements M3 and M4 have the p-type conductivity, the present invention is not limited to this. Specifically, the switching elements M3 and M4 may have, for example, an n-type conductivity.

3.1 Configuration

Figure 5:
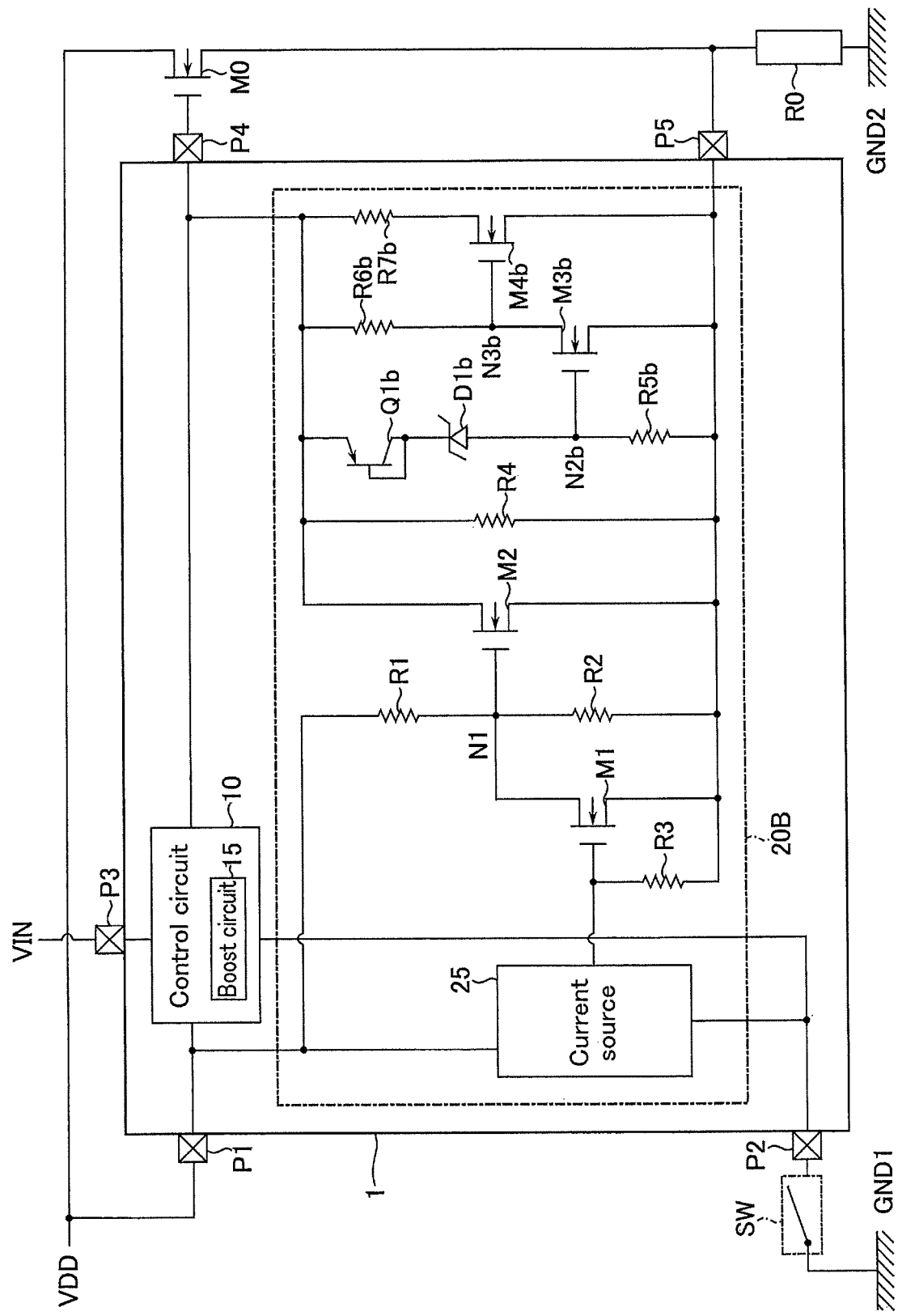
FIG. 5 is a circuit diagram for describing a configuration of a semiconductor device according to a modification.

FIG. 5 is a circuit diagram for describing a configuration of a semiconductor device according to a modification. FIG. 5 corresponds to FIG. 1 of the first embodiment.

As shown in FIG. 5, the semiconductor device 1 includes a GND disconnection-protecting circuit 20B instead of the GND disconnection-protecting circuit 20 shown in FIG. 1.

Instead of the resistors R5, R6, and R7, the switching elements M3, M4, and Q1, as well as the diode D1, the GND disconnection-protecting circuit 20B includes resistors R5b, R6b, and R7b, switching elements M3b, M4b, and Q1b, and a diode D1b. The switching elements M3b and M4b include, for example, MOS transistors having an n-type conductivity. The switching element Q1b includes, for example, a pnp transistor. The diode D1b includes, for example, a Zener diode.

The switching element Q1b, the diode D1b, and the resistor R5b coupled in series are coupled in parallel to the switching element M2 and the resistor R4 between the terminal P4 and the terminal P5.

The switching element Q1b includes a first end (emitter terminal) coupled to the terminal P4, and a second end (base terminal) and a third end (collector terminal) that are coupled to the output terminal of the diode D1b. The diode D1b includes an input terminal coupled to a node N2b. The switching element Q1b and the diode D1b function as a constant voltage source that keeps a potential difference between the terminal P4 and the node N2b at a predetermined value.

The resistor R5b includes a first end coupled to the node N2b and a second end coupled to the terminal. P5.

The resistor R6b and the switching element M3b coupled in series are coupled in parallel to the switching element M2 and the resistor R4 between the terminal P4 and the terminal P5.

The resistor R6b includes a first end coupled to the terminal P4 and a second end coupled to a node N3b. The switching element M3b includes a first end (drain end) coupled to the node N3b, a second end (source end) coupled to the terminal P5, and a gate coupled to the node N2b.

The resistor R7b and the switching element M4b coupled in series are coupled in parallel to the switching element M2 and the resistor R4 between the terminal P4 and the terminal P5.

The resistor R7b includes a first end coupled to the terminal P4 and a second end coupled to the first end (drain end) of the switching element M4b. The switching element M4b includes a second end (source end) coupled to the terminal P5, and a gate coupled to the node N3b. That is, the resistor R7b and the switching element M3b are coupled in series between the terminal P4 and the terminal P5.

The resistor R7b has a lower resistance than the resistors R4, R5b, and R6b. Further, among paths coupled between the terminals P4 and P5, the resistor R7b can have a resistance value lower than a combined resistance of: a resistance value of the path via the resistor R4, a resistance value of a path via the resistor R5b, and a resistance value of a path via the resistor R6b.

By the above-described configuration, the switching element Q1b, the diode D1b, the resistors R5b and R6b, and the switching element M3b can function as a switching element control circuit configured to switch the switching element M4b from OFF to ON when the voltage at the terminal P4 is indeterminate. Also, a path via the resistor R7b where the switching element M4b is switched to ON is a path that, except for the path via the switching element M2 where the switching element M2 is switched to ON, has a lower resistance than the other paths coupled in parallel between the terminal P4 and the terminal P5.

3.2 Operation

Figure 6:
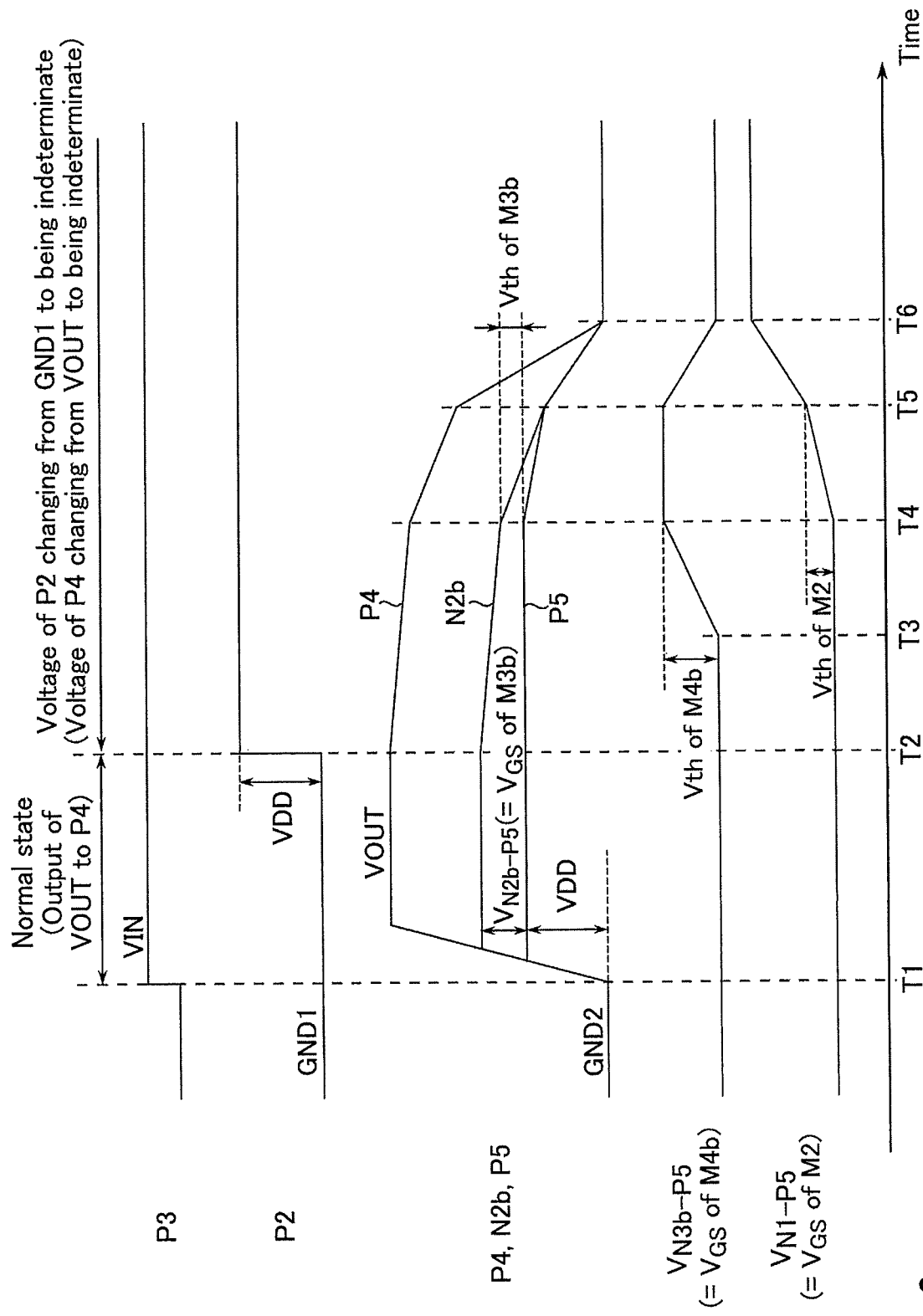
FIG. 6 is a timing chart for describing an operation of the semiconductor device according to the modification.

FIG. 6 is a timing chart for explaining an operation of the semiconductor device according to the modification. FIG. 6 corresponds to FIG. 2 of the first embodiment.

As shown in FIG. 6, at the time T1, the voltage VIN is applied to the terminal P3. Thus, the boost circuit 15 outputs, based on the voltage VDD supplied from the terminal P1 and the voltage GND1 supplied from the terminal P2, the voltage VOUT (>|VDD−GND1|) to the terminal P4. Along with this, the switching element M0 is switched to ON, and the supply of the voltage VDD to the load R0 starts (that is, the voltage at the terminal P5 rises to the voltage VDD).

The voltage at the node N2b decreases relative to the voltage at the terminal P4 to a predetermined value determined by the characteristics of the switching element Q1b and the diode D1b. As a result, a potential difference (denoted in FIG. 6 as "$V_{GS}$ of M3b" or "$V_{N2b-P5}$") between the gate and the source of the switching element M3b is generated. Since the potential difference $V_{N2b-P5}$ exceeds a threshold voltage Vth of the switching element M3b, the switching element M3b is switched to ON, and the terminal P4 and the terminal P5 are electrically coupled via the resistor R6b.

The voltage of the node N3b becomes the voltage VDD when the switching element M3b is switched to ON. Therefore, there is no significant potential difference (denoted in FIG. 6 as "$V_{GS}$ of M4b" or "$V_{N3b-P5}$") between the gate and the source of the switching element M4b. Since the potential difference $V_{N3b-P5}$ is below a threshold voltage Vth of the switching element M4b, the switching element M4b is switched to OFF.

It should be noted that, although not shown in FIG. 6, the current source 25 outputs a predetermined current toward the terminal P5. As a result, a potential difference occurs between the gate and the source of the switching element M1, and the switching element M1 is switched to ON. Therefore, the gate and the source of the switching element M2 are electrically coupled via the switching element M1, and the switching element M2 is switched to OFF.

Subsequently, at the time T2, due to, for example, the occurrence of disconnection, the switch SW is switched from ON to OFF. As a result, the voltage at the terminal P2 goes from the voltage GND1 to being indeterminate. In the example of FIG. 6, the terminal P2 is drawn by the voltage at the terminal P1 and becomes the voltage VDD. As a consequence, the boost circuit 15 cannot boost the voltage VDD, and stops the output of the voltage VOUT to the terminal P4. The voltage at the terminal P4 changes from being fixed at the constant voltage VOUT to being indeterminate.

As the voltage at the terminal P4 becomes indeterminate, the charge of the terminal P4 is gradually drawn to the terminal P5 via either: the resistor R4; the switching element Q1b, the diode D1b, and the resistor R5b; or the resistor R6b and the switching element M3b. Since the voltage at the terminal P4 gradually decreases from the voltage VOUT, the potential difference between the terminal P4 and the terminal P5 gradually decreases.

On the other hand, as described above, since the switching element Q1b and the diode D1b function as a constant voltage source, the voltage of the node N2b gradually decreases as the voltage at the terminal P4 decreases. Therefore, the potential difference $V_{N2b-P5}$ gradually decreases.

It should be noted that, although not shown in FIG. 6, the current source 25 stops the output of the predetermined current toward the terminal P5 when the voltage at the terminal P2 is indeterminate. Thus, there is no potential difference between the gate and the source of the switching element M1, and the switching element M1 is switched to OFF. As a result, the only path coupled between the gate and the source of the switching element M2 is the path via the resistor R2. At the time T2, the voltage at the terminal P5 is the voltage VDD, and the switching element M2 is still switched to OFF.

At the time T3, the operating state of the switching element M3b is gradually switched to OFF, and transitions from, for example, the saturation region to the linear region. Accordingly, the decrease of the potential difference $V_{N2b-P5}$ accelerates, and the potential difference $V_{N3b-P5}$ between the gate and the source of the switching element M4b starts to increase.

At the time T4, the potential difference $V_{N2b-P5}$ is smaller than the threshold voltage Vth of the switching element M3b, and the switching element M3b is switched to OFF. Accordingly, the node N3b is electrically disconnected from the terminal P4, and the potential difference $V_{N3b-P5}$ becomes greater than the threshold voltage Vth of the switching element M4b. As a result, the switching element M4b is switched to ON, and the path electrically connected between the terminal P4 and the terminal P5 via the resistor R7b is formed.

Here, the resistance value of the resistor R7b is smaller than the resistance value of the resistor R4. That is, the force for drawing the charge from the terminal P4 toward the terminal P5 is greater on the path via the resistor R7b than on the path via the resistor R4. Therefore, the voltage decline speed of the terminal P4 after the time T4 is faster than the voltage decline speed from the time T2 to the time T4.

As the voltage at the terminal P4 decreases, the operating state of the switching element M0 is gradually switched to OFF, and, transitions from, for example, the saturation region to the linear region. Along with this, the voltage at the terminal P5 starts to drop from the voltage VDD. As a result, a potential difference between the terminal P1 and the terminal P5 is generated, and a partial voltage determined by the resistors R1 and R2 is applied to the node N1. In this manner, a potential difference (denoted in FIG. 2 as "$V_{GS}$ of M2" or "$V_{N1-P5}$") between the gate and the source of the switching element M2 is generated.

At the time T5, the potential difference $V_{N1-P5}$ becomes greater than a threshold voltage Vth of the switching element M2, and the switching element M2 is switched to ON. Accordingly, the terminals P4 and P5 are electrically coupled via the switching element M2, and the path between the terminals P4 and P5 is substantially shortened. Thereby, the charge of the terminal P4 is rapidly drawn toward the terminal P5, and the switching element M0 is completely switched to OFF at the time T6.

By the above-described operations, the switching element M0 can be quickly switched to OFF after the switch SW is switched to OFF, and malfunction of the switching element M0 due to the switch SW being switched to OFF can be suppressed.

3.3 Effects of Present Modification

According to the present modification, the switching element M3b has an n-type conductivity and includes the gate coupled to the node N2b. The resistor R5b is coupled between the terminal P4 and the node N2b, and the switching element Q1b and the diode D1b are coupled between the terminal P5 and the node N2b. Thus, even when the switching element M3b has an n-type conductivity, it is possible to switch, in response to the voltage at the terminal P4 changing from the voltage VOUT to being indeterminate, the switching element M3b from ON to OFF before the switching element M2 is switched to ON.

Further, the switching element M4b has an n-type conductivity, and the resistor R7b is coupled between the terminal P4 and the switching element M4b. Thus, while the switching element M3b is switched to ON, the switching element M4b is switched to OFF, and, in response to the switching element M3b being switched to OFF, is switched to ON. In this manner, it is possible to form a path coupled between the terminal P4 and the terminal P5 via the resistor R7b before the switching element M2 is switched to ON.

Further, the resistor R7b has a smaller resistance value than the resistor R4b. Therefore, by switching the switching element M4b to ON before the switching element M2 is switched to ON, the voltage at the terminal P4 can be reduced more quickly.

3.4 Other

Moreover, although the first embodiment and the second embodiment described cases where the output terminal of the current source 25 is coupled to the gate of the switching element M1, the present invention is not limited to this. For example, instead of the current source 25, any switching element control circuit can be applied as long as it is configured to be able to output a signal that can switch the switching element M1 to ON when the voltage VDD is supplied to the terminal P1 and the voltage GND1 is supplied to the terminal P2, and that can switch the switching element M1 to OFF when the voltage supplied to either the terminal P1 or the terminal P2 is indeterminate.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor device, comprising:
a boost circuit configured to apply a first voltage to a gate terminal;
a first switching element, a first resistor, and a second resistor that are coupled in parallel between the gate terminal and a source terminal;
a second switching element coupled in series with the second resistor between the gate terminal and the source terminal;
a switching element control circuit configured to switch, in response to a change of a voltage from the first voltage applied from the boost circuit to the gate terminal to being indeterminate, the first switching element to on state after switching the second switching element to on state,
wherein a resistance value of the second resistor is smaller than a resistance value of the first resistor,
wherein the switching element control circuit includes:
a third switching element and a voltage source each coupled in parallel to the first switching element and the second switching element between the gate terminal and the source terminal;
a third resistor coupled in series with the third switching element between the gate terminal and the source terminal; and
a fourth resistor coupled in series with the voltage source between the gate terminal and the source terminal,
wherein the second switching element includes a gate coupled between the third switching element and the third resistor, and
wherein the third switching element includes a gate coupled between the voltage source and the fourth resistor.

2. The device of claim 1,
wherein the resistance value of the second resistor is smaller than a resistance value of the third resistor and a resistance value of the fourth resistor.

3. The device of claim 1,
wherein the voltage source includes a resistor.

4. The device of claim 1,
wherein the voltage source includes a diode and a transistor coupled in series.

5. The device of claim 1,
wherein the second switching element has a p-type conductivity, and
wherein the second resistor is coupled between the second switching element and the source terminal.

6. The device of claim 5,
wherein the third switching element has a p-type conductivity, and
wherein the third resistor is coupled between the third switching element and the source terminal.

7. The device of claim 6,
wherein the fourth resistor is coupled between the voltage source and the gate terminal.

8. The device of claim 1,
wherein the second switching element has an n-type conductivity, and
wherein the second resistor is coupled between the second switching element and the gate terminal.

9. The device of claim 8,
wherein the third switching element has an n-type conductivity, and
wherein the third resistor is coupled between the third switching element and the gate terminal.

10. The device of claim 9,
wherein the fourth resistor is coupled between the voltage source and the source terminal.

11. The device of claim 1,
wherein the boost circuit is configured to apply the first voltage to the gate terminal based on a second voltage supplied to a power supply terminal and a third voltage supplied to a ground terminal, and
wherein the voltage applied from the boost circuit to the gate terminal changes from the first voltage to being indeterminate in response to a change of a voltage of the ground terminal from the third voltage to being indeterminate.

12. The device of claim 11, wherein
the second voltage is greater than the third voltage.

13. The device of claim 12, wherein
the first voltage is greater than a difference between the second voltage and the third voltage.

14. The device of claim 11, wherein
the switching element control circuit further includes:
- a fifth resistor and a sixth resistor that are coupled in series between the power supply terminal and the source terminal;
- a fourth switching element coupled in parallel to the sixth resistor between the fifth resistor and the source terminal; and
- a current source configured to switch, based on the second voltage and the third voltage, the fourth switching element to on state, and to switch, in response to a change of the voltage of the ground terminal from the third voltage to being indeterminate, the fourth switching element to off state.

15. The device of claim 14, wherein
the switching element control circuit further includes a seventh resistor coupled between a gate of the fourth switching element and the source terminal.

* * * * *